United States Patent
Tang et al.

(10) Patent No.: US 11,722,816 B2
(45) Date of Patent: Aug. 8, 2023

(54) SIGNAL PROCESSING CIRCUIT

(71) Applicant: Realtek Semiconductor Corporation, Hsinchu (TW)

(72) Inventors: Wei-Cheng Tang, Hsinchu (TW); Chia-Ling Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 73 days.

(21) Appl. No.: 17/526,084

(22) Filed: Nov. 15, 2021

(65) Prior Publication Data
US 2022/0321085 A1 Oct. 6, 2022

(30) Foreign Application Priority Data

Mar. 31, 2021 (TW) .................................. 110111937

(51) Int. Cl.
*H04R 3/00* (2006.01)
*H03H 7/01* (2006.01)
*H03K 19/20* (2006.01)
*H03K 3/037* (2006.01)

(52) U.S. Cl.
CPC ............. *H04R 3/00* (2013.01); *H03H 7/0153* (2013.01); *H03K 3/037* (2013.01); *H03K 19/20* (2013.01)

(58) Field of Classification Search
CPC ........................................................ H04R 3/00
See application file for complete search history.

(56) References Cited

U.S. PATENT DOCUMENTS

| 8,098,724 | B2 | 1/2012 | Shumarayev et al. | |
| 2008/0310655 | A1* | 12/2008 | Holzmann | H04R 3/00 381/122 |
| 2013/0051582 | A1* | 2/2013 | Kropfitsch | H03F 1/56 330/144 |

* cited by examiner

*Primary Examiner* — Patrick O Neill
(74) *Attorney, Agent, or Firm* — Locke Lord LLP; Tim Tingkang Xia, Esq.

(57) ABSTRACT

A signal processing circuit includes an input buffer circuit and a direct-(DC) voltage detector circuit. The input buffer circuit is coupled to a pin. The pin is configured to receive an input signal. The DC voltage detector circuit is coupled to the pin and the input buffer circuit. The DC voltage detector circuit is configured to detect the input signal to generate a mode signal and generate a bias of the input buffer circuit according to the mode signal.

16 Claims, 9 Drawing Sheets

SIGNAL PROCESSING CIRCUIT

RELATED APPLICATIONS

This application claims priority to Taiwanese Application Serial Number 110111937, filed Mar. 31, 2021, which is herein incorporated by reference.

BACKGROUND

Technical Field

The present disclosure relates to signal processing technology. More particularly, the present disclosure relates to a signal processing circuit with a larger dynamic range.

Description of Related Art

In some related arts of processing signals, a DC blockage (i.e., AC coupled) capacitor is often disposed between an input terminal and a signal processing circuit (e.g., an audio processing circuit). This AC coupled capacitor can filter out DC voltage components of an input signal received at the input terminal such that the signal has a better response in low-frequency parts. However, it would shrink the dynamic range of the signal path.

SUMMARY

Some aspects of the present disclosure are to provide a signal processing circuit. The signal processing circuit includes an input buffer circuit and a direct-current (DC) voltage detector circuit. The input buffer circuit is coupled to a pin which is configured to receive an input signal. The DC voltage detector circuit is coupled to the pin and the input buffer circuit. The DC voltage detector circuit is configured to detect the input signal that can generate a mode signal and a bias of the input buffer circuit accordingly.

As described above, in the present disclosure, the DC voltage detector circuit can detect the DC voltage of the input signal and generate suitable bias voltage of the input buffer circuit. Using this method, the input buffer circuit can maintain a larger dynamic range.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
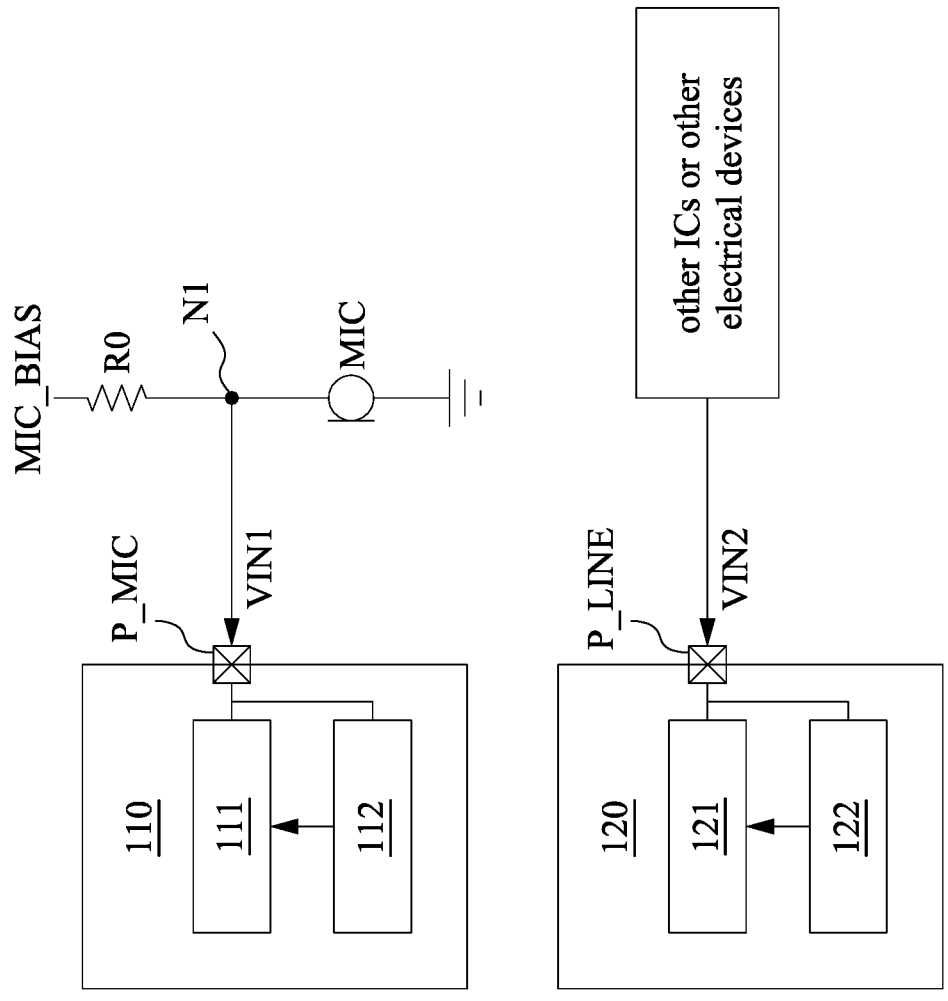
FIG. 1 is a schematic diagram of a signal processing system according to some embodiments of the present disclosure.

Reference is made to FIG. 1. FIG. 1 is a schematic diagram of a signal processing system 100 according to some embodiments of the present disclosure. The signal processing system 100 includes a signal processing circuit 110 and a signal processing circuit 120. The signal processing circuit 110 or the signal processing circuit 120 can be implemented by an integrated circuit (IC).

As illustrated in FIG. 1, the signal processing circuit 110 includes a pin P_MIC, an input buffer circuit 111, and a direct-current (DC) voltage detector circuit 112. In some embodiments, a microphone MIC is coupled to the pin P_MIC. The pin P_MIC is configured to receive audio input signals from the microphone MIC. For example, the pin P_MIC, a resistor R0, and the microphone MIC are coupled at a node N1. The resistor R0 is configured to receive a bias signal MIC_BIAS. The input buffer circuit 111 is coupled to the pin P_MIC and is configured to receive an input signal VIN1 (the input signal VIN1 can be one of the audio input signals from the microphone MIC). The DC voltage detector circuit 112 is coupled to the pin P_MIC and the input buffer circuit 111. The DC voltage detector circuit 112 is configured to detect the DC voltage of the input signal VIN1 which defines a bias of the input buffer circuit 111 according to the detection result.

Similarly, the signal processing circuit 120 includes a pin P_LINE, an input buffer circuit 121, and the DC voltage detector circuit 122. In some embodiments, other integrated circuits or other electrical devices are coupled to the pin P_LINE. The pin P_LINE is configured to receive audio input signals from these integrated circuits or these electrical devices. The input buffer circuit 121 is coupled to the pin P_LINE and is configured to receive an input signal VIN2 (the input signal VIN2 can be one of the audio input signals from these integrated circuits or these electrical devices). The DC voltage detector circuit 122 is coupled to the pin P_LINE and the input buffer circuit 121, and the DC voltage detector circuit 122 is configured to detect the DC voltage of the input signal VIN2 to generate the bias of the input buffer circuit 121 according to the detection result.

What is specially stated is that, the input signals in the above paragraphs and in the following paragraphs are "audio signals", but the present disclosure is not limited thereto. In some other embodiments, the input signals are not the "audio signals".

Figure 2:
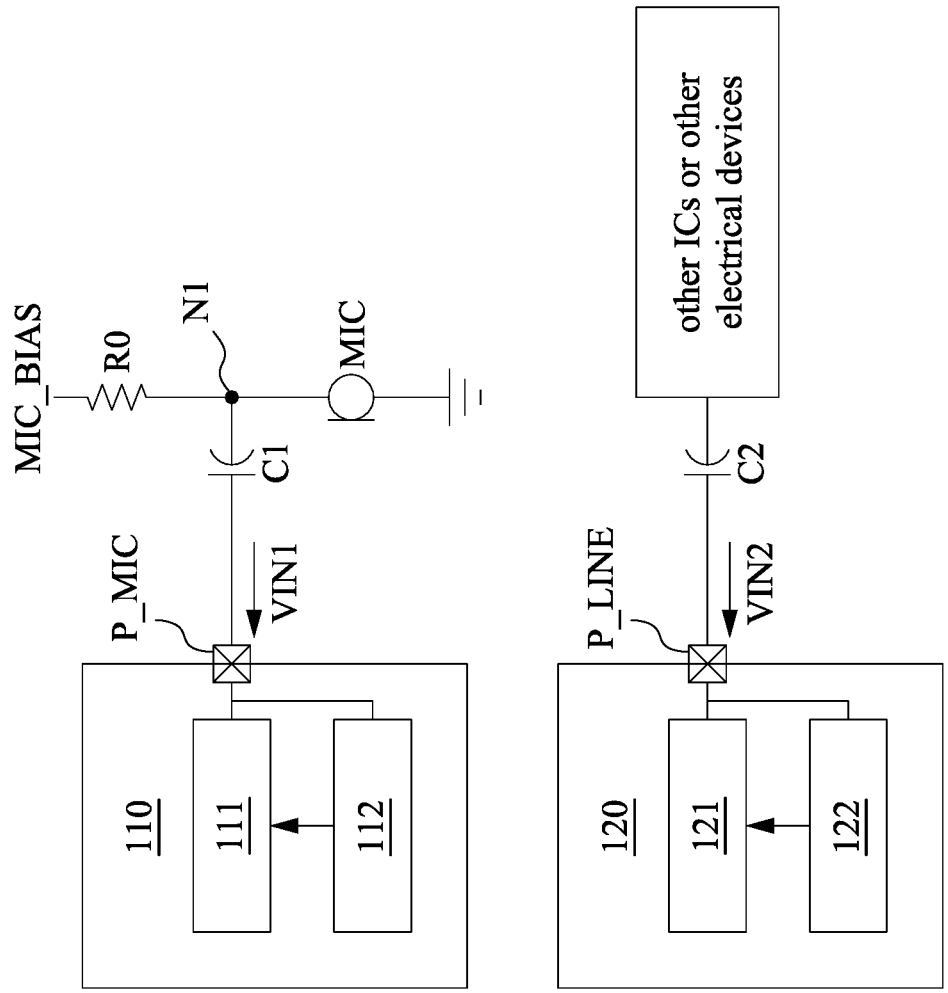
FIG. 2 is a schematic diagram of a signal processing system according to some embodiments of the present disclosure.

Reference is made to FIG. 2. FIG. 2 is a schematic diagram of a signal processing system 200 according to some embodiments of the present disclosure. Compared to the signal processing system 100 in FIG. 1, the signal processing system 200 in FIG. 2 further includes an alternating-current (AC) voltage coupled capacitor C1 and an AC coupled capacitor C2. The AC coupled capacitor C1 is coupled between the pin P_MIC and the node N1, and the AC coupled capacitor C2 is coupled between the pin P_LINE and other integrated circuits or other electrical devices. The AC coupled capacitor C1 is configured to filter out the DC voltage components of the signal from the node N1 (i.e., the input signal VIN1). Similarly, the AC coupled capacitor C2 is configured to filter out the DC voltage components of the signal from other integrated circuits or other electrical devices (i.e., the input signal VIN2). In some embodiments, the AC coupled capacitors C1-C2 are disposed on one or more printed circuit boards (PCB). Since the operation of the signal processing system 200 in FIG. 2 is similar to the operation of the signal processing system 100 in FIG. 1, it is not described herein again.

As illustrated in FIG. 1, the signal processing system 100 is not equipped with the AC coupled capacitors C1 and C2 (shown in FIG. 2). Therefore, the signal processing system 100 in FIG. 1 has smaller area and lower cost than the signal processing system 200 in FIG. 2.

In some related arts, for a flat response in low-frequency band, an AC coupled capacitor is utilized in the system to filter out the DC voltage components of the input signal. However, it would have a lower degree of dynamic range of the signal path.

Compared to the aforementioned related arts, in the present disclosure, no matter whether the signal processing system has the AC coupled capacitors or not (e.g., the signal processing system 200 in FIG. 2 has the AC coupled capacitors and the signal processing system 100 in FIG. 1 has no AC coupled capacitors), the DC voltage detector circuit 112 (or the DC voltage detector circuit 122) can detect the DC voltage components of the input signal VIN1 (or the input signal VIN2), and provide the bias of the input buffer circuit 111 (or the input buffer circuit 121) according to the detection result. Therefore, the input buffer circuit 111 (or the input buffer circuit 121) can be biased by an appropriate DC common mode voltage such that the dynamic range of the signals can be larger.

Figure 3:
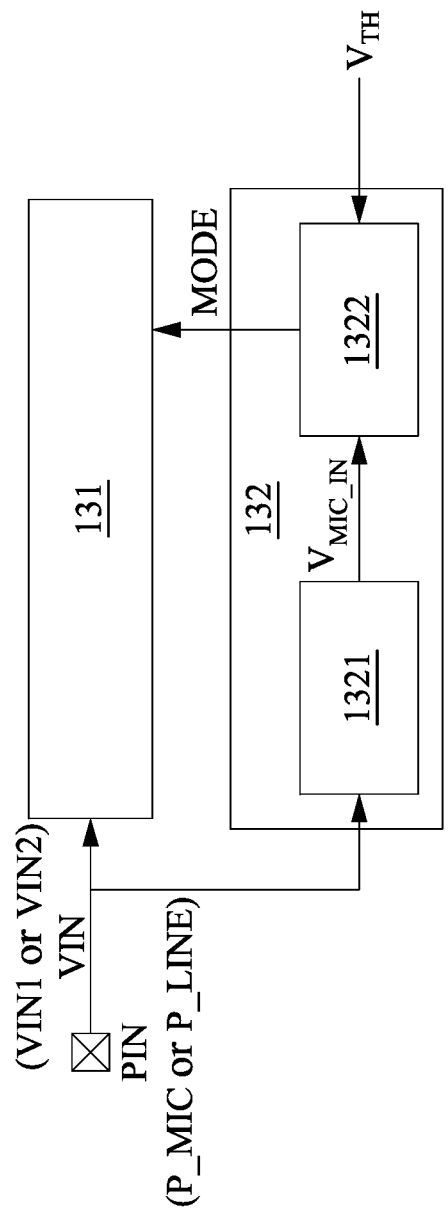
FIG. 3 is a functional block diagram of a signal processing circuit according to some embodiments of the present disclosure.

Reference is made to FIG. 3. FIG. 3 is a functional block diagram of a signal processing circuit 300 according to some embodiments of the present disclosure. In some embodiments, the signal processing circuit 300 is configured to implement the signal processing circuit 110 or the signal processing circuit 120 in FIG. 1 (or in FIG. 2).

As illustrated in FIG. 3, the signal processing circuit 300 includes an input buffer circuit 131 and a DC voltage detector circuit 132. The DC voltage detector circuit 132 includes a DC voltage generator circuit 1321 and a mode selector circuit 1322. The DC voltage generator circuit 1321 is connected to a pin PIN to receive an input signal VIN. The pin PIN can either be chosen from the pin P_MJC or the pin P_LINE in FIG. 1 (or in FIG. 2). The input signal VIN can be the input signal VIN1 or the input signal VIN2 in FIG. 1 (or in FIG. 2). The DC voltage generator circuit 1321 is configured to track the input signal VIN and generate a DC voltage $V_{MIC\_IN}$. The mode selector circuit 1322 is coupled to the DC voltage generator circuit 1321 and the input buffer circuit 131. The mode selector circuit 1322 is configured to receive a threshold voltage $V_{TH}$, which can be compared with the DC voltage $V_{MIC\_IN}$ in order to generate a mode signal MODE. Accordingly, the input buffer circuit 131 can have a proper bias owing to the mode signal MODE.

Figure 4:
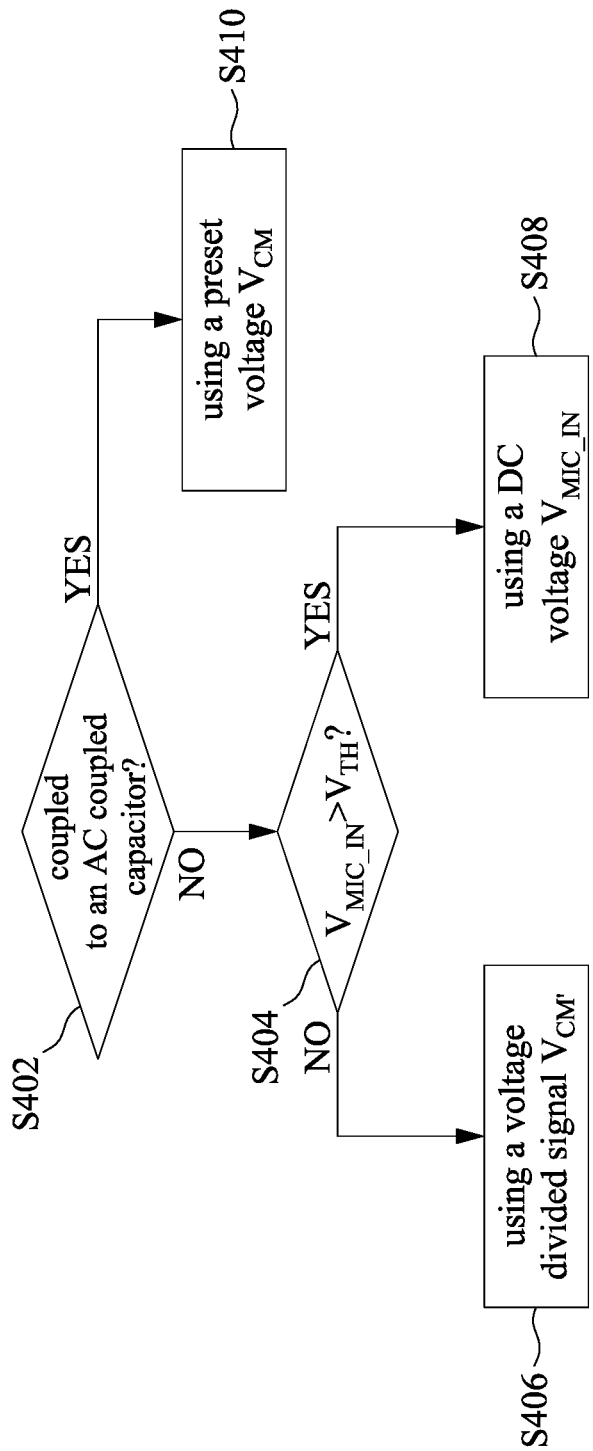
FIG. 4 is a flow diagram of an operation method of the signal processing circuit in FIG. 3 according to some embodiments of the present disclosure.

Reference is made to FIG. 4. FIG. 4 is a flow diagram of an operation method 400 of the signal processing circuit 300 in FIG. 3 according to some embodiments of the present disclosure.

Operation S402 is determining whether the pin PIN in the signal processing circuit 300 is connected to the AC coupled capacitor C1 or the AC coupled capacitor C2 in FIG. 2. If the pin PIN is not connected to the AC coupled capacitors (as shown in the embodiment in FIG. 1), it enters operation S404. If the pin PIN is connected to the AC coupled capacitors (as shown in the embodiment in FIG. 2), operation S410 is entered.

Operation S404 is determining whether the DC voltage $V_{MIC\_IN}$ detected by the DC voltage generator circuit 1321 is greater than the threshold voltage $V_{TH}$ or not. If the DC voltage $V_{MIC\_IN}$ is not greater than (i.e., lower than or equal to) the threshold voltage $V_{TH}$, operation S406 is entered. If the DC voltage $V_{MIC\_IN}$ is greater than the threshold voltage $V_{TH}$, operation S408 is entered.

Figure 5:
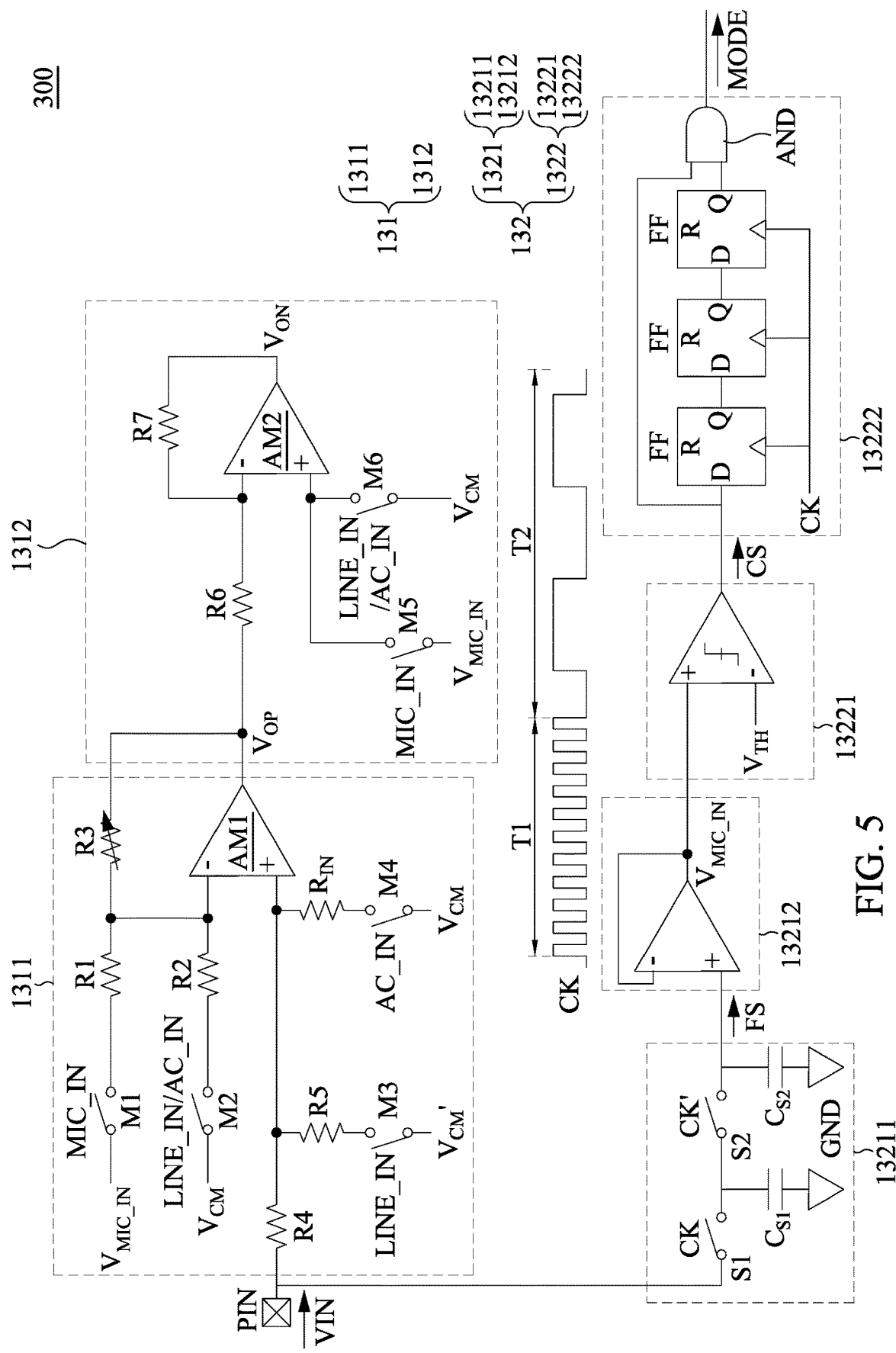
FIG. 5 is a circuit diagram of the signal processing circuit in FIG. 3 according to some embodiments of the present disclosure.

In operation S406, the input buffer circuit 131 uses a voltage divided signal $V_{CM}'$ (e.g., in FIG. 5). For example, the voltage divided signal $V_{CM}'$ can be generated by another operational amplifier, and can be fed to the input buffer circuit 131 (e.g., inputted into a common mode voltage converter circuit 1311 in FIG. 5).

In operation S408, the input buffer circuit 131 uses the DC voltage $V_{MIC\_IN}$. For example, the DC voltage $V_{MIC\_IN}$ can be generated by a unity gain buffer circuit 13212 of the DC voltage generator circuit 1321 in FIG. 5, and can be fed to the input buffer circuit 131 (e.g., inputted into the common mode voltage converter circuit 1311 and an inverter circuit 1312 in FIG. 5).

In operation S410, the input buffer circuit 131 uses a preset voltage $V_{CM}$. For example, the preset voltage $V_{CM}$ can be generated by another power supply, and can be fed to the input buffer circuit 131 (e.g., inputted into the common mode voltage converter circuit 1311 and the inverter circuit 1312 in FIG. 5).

Reference is made to FIG. 5. FIG. 5 is a circuit diagram of the signal processing circuit 300 in FIG. 3 according to some embodiments of the present disclosure. Similar to FIG. 3, the signal processing circuit 300 in FIG. 5 includes the input buffer circuit 131 and the DC voltage detector circuit 132. The DC voltage detector circuit 132 includes the DC voltage generator circuit 1321 and the mode selector circuit 1322.

The input buffer circuit 131 includes the common mode voltage converter circuit 1311 and the inverter circuit 1312. The DC voltage generator circuit 1321 includes a low-pass filter (LPF) circuit 13211 and the unity gain buffer circuit 13212. The mode selector circuit 1322 includes a comparator circuit 13221 and a de-bounce circuit 13222.

The common mode voltage converter circuit 1311 is controlled by a control signal LINE_IN, a control signal MIC_IN, and a control signal AC_IN. The common mode voltage converter circuit 1311 generates an output signal $V_{OP}$ according to the input signal VIN, the DC voltage $V_{MIC\_IN}$, the preset voltage $V_{CM}$, the voltage divided signal $V_{CM}'$, and the input signal VIN. As illustrated in FIG. 5, the common mode voltage converter circuit 1311 includes an amplifier AM1, switches M1-M4, resistors R1-R5. In some embodiments, the resistor R3 can be implemented by a variable resistor. A value of the resistor R5 can be expressed by the formula (1) below:

$$N \times r \qquad (1)$$

in which r is a value of the resistor R4, and N is a positive integer (e.g., can be a ratio of two resistors).

The amplifier AM1 includes a negative input terminal, a positive input terminal, and an output terminal. The switch M1 is configured to receive the DC voltage $V_{MIC\_IN}$ and is controlled by the control signal MIC_IN. The resistor R1 is coupled between the switch M1 and the negative input terminal of the amplifier AM1. The switch M2 is configured to receive the preset voltage $V_{CM}$ and the switch M2 is controlled by the control signal LINE_IN or the control signal AC_IN. The resistor R2 is coupled between the switch M2 and the negative input terminal of the amplifier AM1. The resistor R3 is coupled between the output terminal of the amplifier AM1 and the negative input terminal of the amplifier AM1. The resistor R4 is coupled between the pin PIN and the positive input terminal of the amplifier AM1. The switch M3 is configured to receive the voltage divided signal $V_{CM}'$ associated with the preset voltage $V_{CM}$ and the switch M3 is controlled by the control signal LINE_IN. With such configuration, the voltage divided signal $V_{CM}'$ can be set as (N+1) times the preset voltage $V_{CM}$. The resistor R5 is coupled between the switch M3 and the positive input terminal of the amplifier AM1. The switch M4 is configured to receive the preset voltage $V_{CM}$ and the switch M4 is controlled by the control signal AC_IN.

The inverter circuit 1312 is controlled by the control signal LINE_IN and the control signal MIC_IN, and generates an inversion output signal $V_{ON}$ according to the output signal $V_{OP}$. The output signal $V_{OP}$ and the inversion output signal $V_{ON}$ can be transmitted to a next-stage processor circuit, and this processor circuit can perform a fully differential process on the output signal $V_{OP}$ and the inversion output signal $V_{ON}$. As illustrated in FIG. 5, the inverter circuit 1312 includes an amplifier AM2, switches M5-M6, and resistors R6-R7. The amplifier AM2 includes a negative input terminal, a positive input terminal, and an output terminal. The resistor R6 is coupled between the output terminal of the amplifier AM1 and the negative input terminal of the amplifier AM2. The resistor R7 is coupled between the output terminal of the amplifier AM2 and the negative input terminal of the amplifier AM2. The switch M5 is configured to receive the DC voltage $V_{MIC\_IN}$ and the switch M5 is controlled by the control signal MIC_IN. The switch M5 is coupled to the positive input terminal of the amplifier AM2. The switch M6 is configured to receive the preset voltage $V_{CM}$ and the switch M6 is controlled by the control signal LINE_IN or the control signal AC_IN. The switch M6 is coupled to the positive input terminal of the amplifier AM2.

The LPF circuit 13211 generates a filtered signal FS according to the input signal VIN. As illustrated in FIG. 5, the LPF circuit 13211 is a one-stage LPF circuit. The LPF circuit 13211 includes switches S1-S2 and capacitors $C_{S1}$-$C_{S2}$. A first terminal of the switch S1 is coupled to the pin PIN. A second terminal of the switch S1 is coupled to a first terminal of the switch S2. A second terminal of the switch S2 is coupled to a positive terminal of the unity gain buffer circuit 13212. The switch S1 is controlled by a clock signal CK. The switch S2 is controlled by an inversion clock signal CK'. The capacitor $C_{S1}$ is coupled between the first terminal of the switch S2 and a ground terminal GND. The capacitor $C_{S2}$ is coupled between the second terminal of the switch S2 and the ground terminal GND. In this arrangement, the switch S1, the switch S2, and the capacitor $C_{S1}$ form an equivalent resistor, this equivalent resistor and the capacitor $C_{S2}$ form a resistor-capacitor circuit (RC circuit), and this RC circuit corresponds to a time constant.

As illustrated in FIG. 5, a clock rate of the clock signal CK in a time interval T1 is higher than that in a time interval T2, and the time interval T1 is earlier than the time interval T2 on a timeline. In other words, a resistance of the aforementioned equivalent resistor in the time interval T1 is lower and the resistance in the time interval T2 is greater. In this manner, the clock signal CK in the time interval T1 whose clock rate is higher can make the filtered signal FS to be quickly charged to a certain level, and the clock signal CK in the time interval T2 whose clock rate is lower can effectively filter out the high-frequency components.

An output terminal of the unity gain buffer circuit 13212 is coupled to a negative input terminal of the unity gain buffer circuit 13212. The unity gain buffer circuit 13212 generates the DC voltage $V_{MIC\_IN}$ according to the filtered signal FS. Since a gain of the unity gain buffer circuit 13212 is approximately 1, a voltage value of the filtered signal FS is substantially identical to that of the DC voltage $V_{MIC\_IN}$. As described above, the DC voltage $V_{MIC\_IN}$ can be generated by the unity gain buffer circuit 13212, and can be inputted to the common mode voltage converter circuit 1311 and the inverter circuit 1312 from the unity gain buffer circuit 13212.

A positive input terminal of the comparator circuit 13221 is coupled to the output terminal of the unity gain buffer circuit 13212 to receive the DC voltage $V_{MIC\_IN}$. A negative input terminal of the comparator circuit 13221 is configured to receive the threshold voltage $V_{TH}$. Accordingly, the comparator circuit 13221 can compare the DC voltage $V_{MIC\_IN}$ with the threshold voltage $V_{TH}$ to generate a comparison signal CS.

The de-bounce circuit 13222 includes at least one flip-flop FF and a logic AND gate AND. The de-bounce circuit 13222 is configured to perform a de-bounce process on the comparison signal CS to generate the mode signal MODE. The purpose of the de-bounce process is to avoid drastic variation of the mode signal MODE. For example, the de-bounce circuit 13222 in FIG. 5 includes three flip-flops FF, but the present disclosure is not limited thereto. These flip-flops FF are configured to receive the comparison signal CS and these flip-flops FF are controlled by the clock signal CK. The logic AND gate AND is configured to receive an output signal from the last flip-flop FF and the comparison signal CS to perform an AND calculation on them to generate the mode signal MODE. Each of the flip-flops FF is enabled to transmit a signal from its input terminal to its output terminal when its clock signal CK is enabled. Thus, these flip-flops FF coupled in series can avoid drastic variation of the mode signal MODE.

Figure 6:
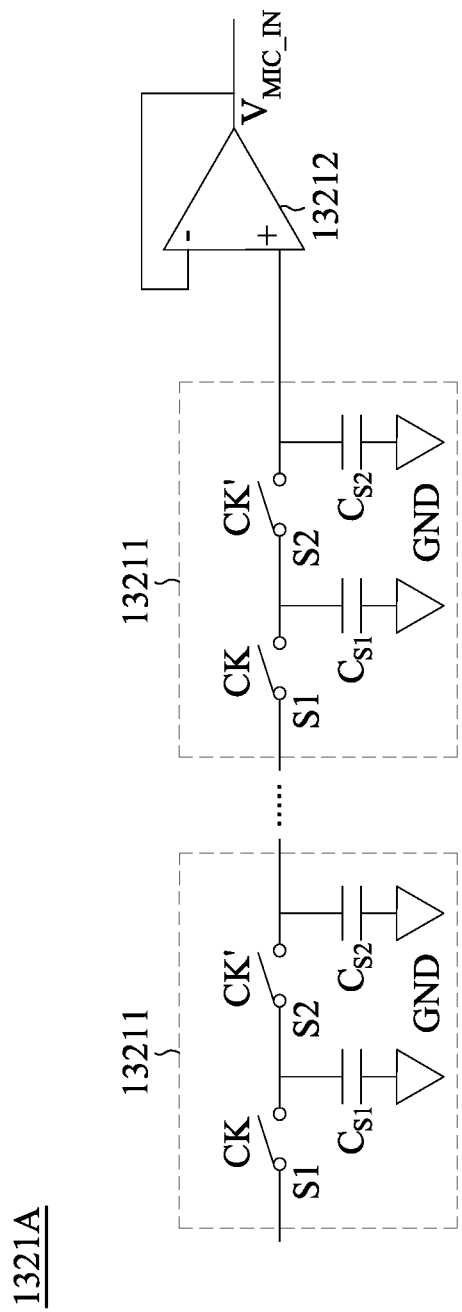
FIG. 6 is a circuit diagram of a DC voltage generator circuit according to some embodiments of the present disclosure.

Reference is made to FIG. 6. FIG. 6 is a circuit diagram of a DC voltage generator circuit 1321A according to some embodiments of the present disclosure. The major difference between the DC voltage generator circuit 1321A in FIG. 6 and the DC voltage generator circuit 1321 in FIG. 5 is that the DC voltage generator circuit 1321A in FIG. 6 includes a plurality of one-stage LPF circuits 13211 coupled in series. Accordingly, the DC voltage generator circuit 1321A can filter out high-frequency components more effectively.

Figure 7:
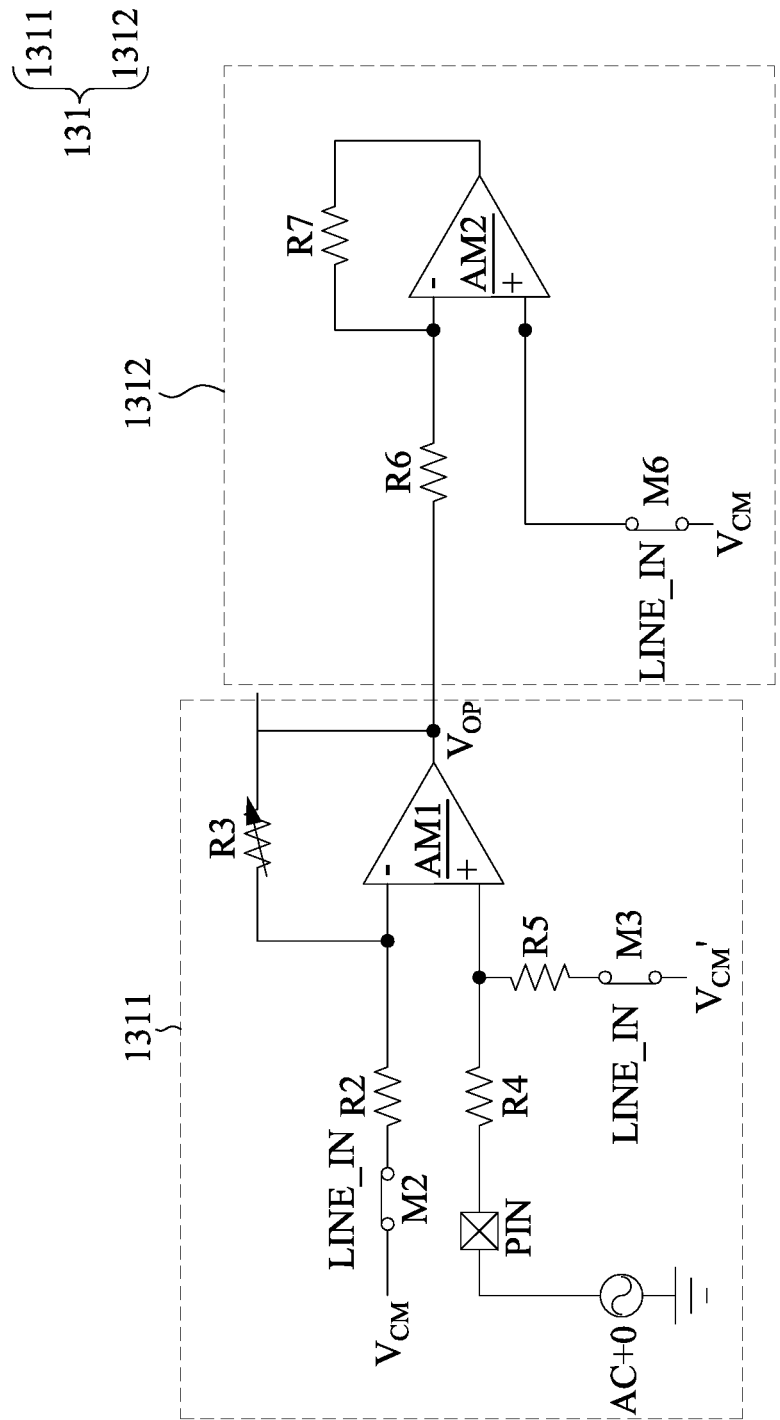
FIG. 7 is an equivalent circuit diagram of the signal processing circuit in FIG. 5 operating in a first mode according to some embodiments of the present disclosure.

Reference is made to FIG. 5 again. If the pin PIN in the signal processing circuit 300 is the pin P_LINE in FIG. 1, the pin PIN in the signal processing circuit 300 can receive the input signal VIN2. The DC voltage generator circuit 1321 can track the input signal VIN2 and generate the DC voltage $V_{MIC\_IN}$, and the comparator circuit 13221 can compare the DC voltage $V_{MIC\_IN}$ with the threshold voltage $V_{TH}$. Since the input signal VIN2 from the pin P_LINE in FIG. 1 is usually an AC voltage biased at 0 volt, the DC voltage $V_{MIC\_IN}$ is not greater than (i.e., equal to or lower than) the threshold voltage $V_{TR}$. In this case, the comparison signal CS has a logic value 0. Since the comparison signal CS has the logic value 0, the mode signal MODE has the logic value 0. In some embodiments, when the mode signal MODE has the logic value 0, the control signal MIC_IN has the logic value 0 and the control signal LINE_IN has a logic value 1 (hereafter "a first mode"). For example, the input buffer circuit 131 can use the mode signal MODE as the control signal MIC_IN. In addition, the input buffer circuit 131 can include an inverter, and this inverter can receive the mode signal MODE and perform an inversion process on the mode signal MODE to generate the control signal LINE_IN. In this case, the signal processing circuit 300 in FIG. 5 is simplified to be equivalent to FIG. 7. FIG. 7 is an equivalent circuit diagram of the signal processing circuit 300 in FIG. 5 operating in the first mode according to some embodiments of the present disclosure. FIG. 7 merely illustrates the input buffer circuit 131 in FIG. 3 and the DC voltage detector circuit 132 in FIG. 3 is omitted. As illustrated in FIG. 7, the voltage divided signal $V_{CM}{}'$ is inputted into the input buffer circuit 131 (as operation S406 in FIG. 4). In some embodiments, when the mode signal MODE has the logic value 0, a power supply of the DC voltage generator circuit 1321 can be shut down.

Figure 8:
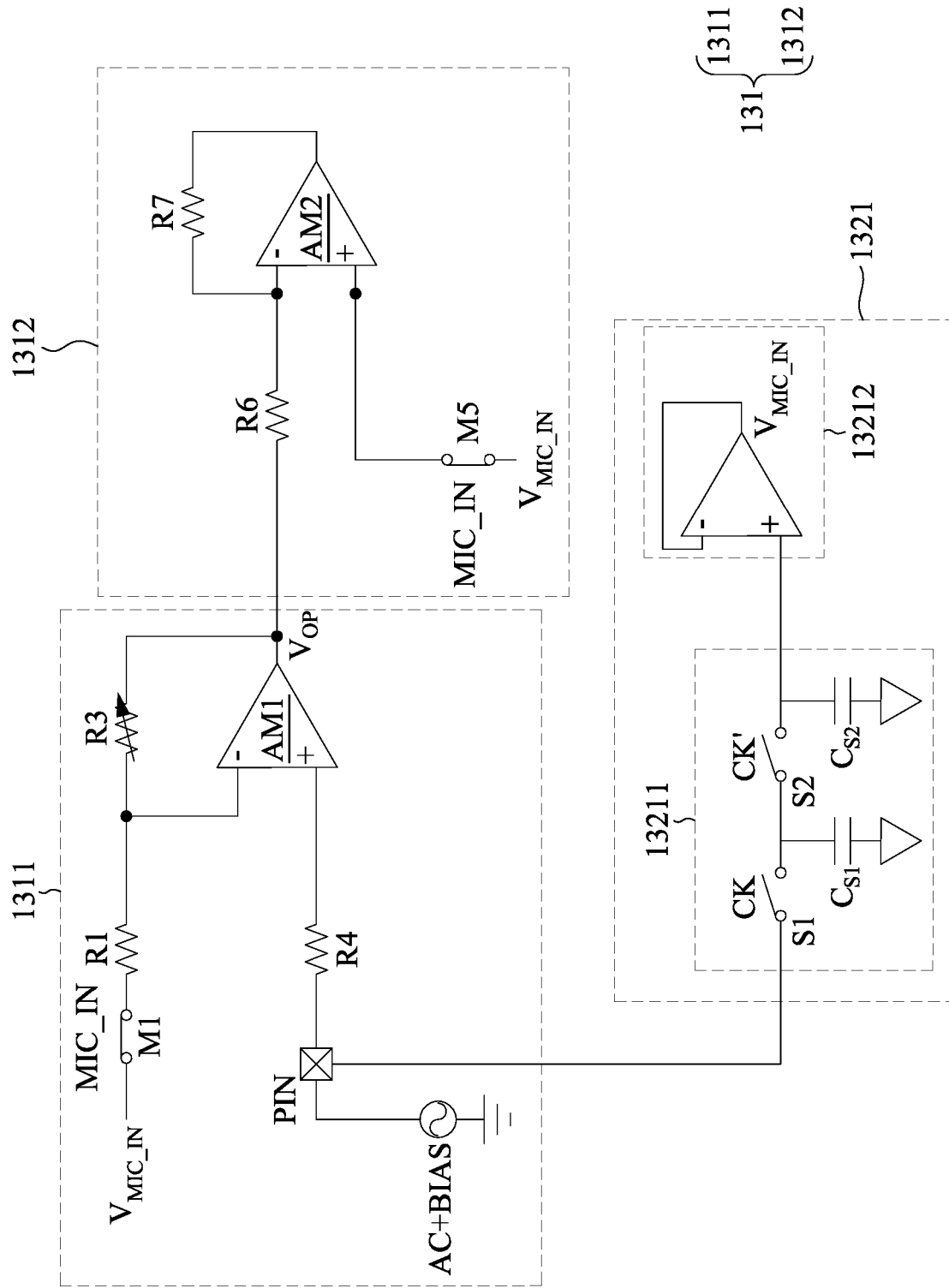
FIG. 8 is an equivalent circuit diagram of the signal processing circuit in FIG. 5 operating in a second mode according to some embodiments of the present disclosure.

Reference is made to FIG. 5 again. If the pin PIN in the signal processing circuit 300 is the pin P_MIC in FIG. 1, the pin PIN in the signal processing circuit 300 can receive the input signal VIN1. The DC voltage generator circuit 1321 can track the input signal VIN1 and generate the DC voltage $V_{MIC\_IN}$, and the comparator circuit 13221 can compare the DC voltage $V_{MIC\_IN}$ with the threshold voltage $V_{TH}$. Since the input signal VIN1 from the pin P_MIC in FIG. 1 is usually an AC voltage AC with a bias voltage BIAS (e.g., 2.8 volts, but the present disclosure is not limited thereto), the DC voltage $V_{MIC\_IN}$ is greater than the threshold voltage $V_{TH}$. In this case, the comparison signal CS has the logic value 1. Since the comparison signal CS has the logic value 1, the mode signal MODE has the logic value 1 (hereafter "a second mode"). In some embodiments, when the mode signal MODE has the logic value 1, the control signal MIC_IN has the logic value 1 and the control signal LINE_IN/AC_IN has the logic value 0. Accordingly, the signal processing circuit 300 in FIG. 5 is in a simplified form that is substantially equivalent to FIG. 8. FIG. 8 is an equivalent circuit diagram of the signal processing circuit 300 in FIG. 5 operating in the second mode according to some embodiments of the present disclosure. As illustrated in FIG. 8, the DC voltage $V_{MIC\_IN}$ is inputted into the input buffer circuit 131 (as operation S408 in FIG. 4).

Figure 9:
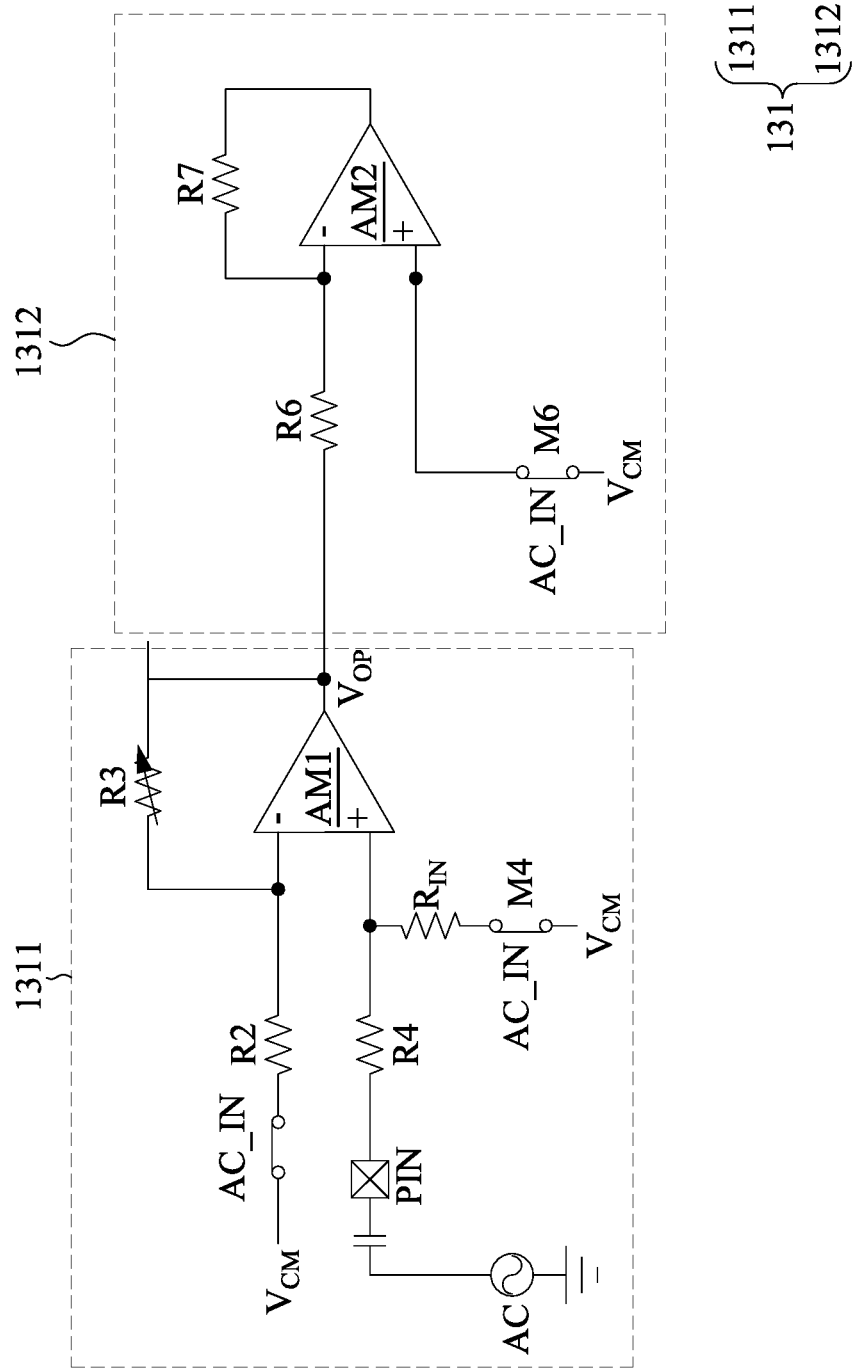
FIG. 9 is an equivalent circuit diagram of the signal processing circuit in FIG. 5 operating in a third mode according to some embodiments of the present disclosure.

Reference is made to FIG. 5 again. If the pin PIN in the signal processing circuit 300 is the pin P_MIC or the pin P_LINE in FIG. 2 (i.e., with the AC coupled capacitor C1 or the AC coupled capacitor C2), the pin PIN in the signal processing circuit 300 can receive the input signal VIN1 or the input signal VIN2 passing through the AC coupled capacitor C1 or C2. The input signal VIN1 or the input signal VIN2 passing through the AC coupled capacitor C1 or C2 is usually an AC voltage AC. In this case, the DC voltage detector circuit 132 can be disabled and the control signal AC_IN has the logic value 1. Accordingly, the signal processing circuit 300 in FIG. 5 is in a simplified form that is substantially equivalent to FIG. 9. FIG. 9 is an equivalent circuit diagram of the signal processing circuit 300 in FIG. 5 operating in a third mode according to some embodiments of the present disclosure. As illustrated in FIG. 9, the preset voltage $V_{CM}$ is fed to the input buffer circuit 131 (as operation S410 in FIG. 4). In some embodiments, a power supply in the DC voltage detector circuit 132 can be shut down to disable the DC voltage detector circuit 132.

As described above, in the present disclosure, the DC voltage detector circuit can detect the DC voltage of the input signal and generate suitable bias voltage of the input buffer circuit. Using this method, the input buffer circuit can provide a larger dynamic range.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A signal processing circuit, comprising:
   an input buffer circuit coupled to a pin, wherein the pin is configured to receive an input signal; and
   a direct-current (DC) voltage detector circuit coupled to the pin and the input buffer circuit, wherein the DC voltage detector circuit is configured to detect the input signal to generate a mode signal and generate a bias of the input buffer circuit according to the mode signal.

2. The signal processing circuit of claim 1, wherein the DC voltage detector circuit comprises:
   a DC voltage generator circuit coupled to the pin and configured to generate a DC voltage according to the input signal; and
   a mode selector circuit coupled to the DC voltage generator circuit to generate the mode signal according to the DC voltage and a threshold voltage.

3. The signal processing circuit of claim 2, wherein the DC voltage generator circuit comprises:
   a low-pass filter (LPF) circuit coupled to the pin and configured to generate a filtered signal according to the input signal; and
   a unity gain buffer circuit coupled to the LPF circuit and configured to generate the DC voltage according to the filtered signal.

4. The signal processing circuit of claim 3, wherein the mode selector circuit comprises:
   a comparator circuit configured to couple the unity gain buffer circuit and compare the DC voltage with the threshold voltage to generate a comparison signal; and
   a de-bounce circuit configured to perform a de-bounce process on the comparison signal in order to generate the mode signal.

5. The signal processing circuit of claim 4, wherein the input buffer circuit comprises:
   a common mode voltage converter circuit controlled by a first control signal, a second control signal, and a third control signal, and configured to generate an output signal according to the DC voltage, a preset voltage, and the input signal; and an inverter circuit controlled by the first control signal and the second control signal, and configured to output an inversion output signal according to the input signal, wherein the output signal and the inversion output signal are provided to a next-stage processor circuit for a fully differential process.

6. The signal processing circuit of claim 5, wherein the common mode voltage converter circuit comprises:

a first amplifier comprising a first input terminal, a second input terminal, and a first output terminal;

a first switch, controlled by the second control signal, configured to receive the DC voltage;

a first resistor coupled between the first switch and the first input terminal;

a second switch, controlled by the first control signal or the third control signal, configured to receive the preset voltage;

a second resistor coupled between the second switch and the first input terminal;

a third resistor coupled between the first output terminal and the first input terminal;

a fourth resistor coupled between the pin and the second input terminal;

a third switch configured to receive a voltage divided signal associated with the preset voltage and controlled by the first control signal;

a fifth resistor coupled between the third switch and the second input terminal; and a fourth switch configured to receive the preset voltage and coupled to the second input terminal, wherein the fourth switch is controlled by the third control signal.

7. The signal processing circuit of claim 6, wherein the inverter circuit comprises:

a second amplifier comprising a third input terminal, a fourth input terminal, and a second output terminal;

a sixth resistor coupled between the first output terminal and the third input terminal;

a seventh resistor coupled between the second output terminal and the third input terminal;

a fifth switch configured to receive the DC voltage and coupled to the fourth input terminal, wherein the fifth switch is controlled by the second control signal; and a sixth switch configured to receive the preset voltage and coupled to the fourth input terminal, wherein the sixth switch is controlled by the first control signal or the third control signal.

8. The signal processing circuit of claim 5, wherein the comparison signal, the mode signal, and the second control signal have a first logic value and the first control signal has a second logic value when the DC voltage is equal to or lower than the threshold voltage, wherein the comparison signal, the mode signal, and the second control signal have the second logic value and the first control signal has the first logic value when the DC voltage is greater than the threshold voltage.

9. The signal processing circuit of claim 8, wherein when the pin is coupled to an alternating-current (AC) coupled capacitor, the DC voltage detector circuit is disabled and the third control signal has the second logic value.

10. The signal processing circuit of claim 4, wherein the de-bounce circuit comprises:

at least one flip-flop configured receive the comparison signal; and an AND gate coupled to the at least one flip-flop to output the mode signal.

11. The signal processing circuit of claim 3, wherein the LPF circuit is an one-stage LPF circuit.

12. The signal processing circuit of claim 11, wherein the one-stage LPF circuit comprises:

a first switch controlled by a clock signal;

a second switch comprising a first terminal and a second terminal, wherein the first terminal is coupled to the first switch and the second terminal is coupled to the unity gain buffer circuit, wherein the second switch is controlled by an inversion clock signal;

a first capacitor coupled between the first terminal and a ground terminal; and a second capacitor coupled between the second terminal and the ground terminal.

13. The signal processing circuit of claim 12, wherein the clock signal corresponds to a first time interval and a second time interval, the first time interval is earlier than the second time interval on a timeline, and a clock rate of the clock signal in the first time interval is higher than a clock rate of the clock signal in the second time interval.

14. The signal processing circuit of claim 3, wherein the LPF circuit comprises a plurality of one-stage LPF circuits.

15. The signal processing circuit of claim 1, wherein the input signal is an audio input signal.

16. The signal processing circuit of claim 15, wherein the audio input signal is from a microphone, an integrated circuit, or an electrical device coupled to the signal processing circuit.

\* \* \* \* \*